(12) United States Patent
Buth et al.

(10) Patent No.: US 11,810,958 B2
(45) Date of Patent: Nov. 7, 2023

(54) TRANSISTOR COMPONENT HAVING GATE ELECTRODES AND FIELD ELECTRODES

(71) Applicant: Infineon Technologies AG, Neubiberg (DE)

(72) Inventors: Felix Buth, Munich (DE); Margarete Deckers, Munich (DE); Christian Feuerbaum, Munich (DE); Uwe Schmalzbauer, Siegertsbrunn (DE); Markus Zundel, Egmating (DE)

(73) Assignee: Infineon Technologies AG, Neubiberg (DE)

( * ) Notice: Subject to any disclaimer, the term of this patent is extended or adjusted under 35 U.S.C. 154(b) by 170 days.

(21) Appl. No.: 17/400,213

(22) Filed: Aug. 12, 2021

(65) Prior Publication Data

US 2022/0052171 A1    Feb. 17, 2022

(30) Foreign Application Priority Data

Aug. 13, 2020    (DE) .......................... 102020121333.6

(51) Int. Cl.
| | |
|---|---|
| H01L 29/423 | (2006.01) |
| H01L 29/06 | (2006.01) |
| H01L 29/78 | (2006.01) |
| H01L 29/40 | (2006.01) |

(52) U.S. Cl.
CPC ...... H01L 29/4236 (2013.01); H01L 29/0696 (2013.01); H01L 29/404 (2013.01); H01L 29/4238 (2013.01); H01L 29/7813 (2013.01)

(58) Field of Classification Search
CPC ............. H01L 29/4236; H01L 29/0696; H01L 29/404; H01L 29/4238; H01L 29/7813

USPC ........................................................ 257/288
See application file for complete search history.

(56) References Cited

U.S. PATENT DOCUMENTS

2008/0179670 A1*  7/2008  Willmeroth ......... H01L 29/7825
                                                  257/E29.007
2019/0386133 A1* 12/2019  Boianceanu .... H01L 21/823487

FOREIGN PATENT DOCUMENTS

| DE | 102016105038 A1 | 9/2016 |
| DE | 102015108440 B3 | 10/2016 |
| DE | 102018114591 A1 | 12/2019 |

* cited by examiner

*Primary Examiner* — Igwe U Anya
(74) *Attorney, Agent, or Firm* — Murphy, Bilak & Homiller, PLLC

(57) ABSTRACT

A transistor includes: gate electrodes and field electrodes, wherein in each case one gate electrode and one field electrode are arranged one above another in a vertical direction in a common trench of a semiconductor body; a gate pad to which the gate electrodes are connected; and a source metallization arranged above the semiconductor body. The field electrodes of a first group include at least one contact section. The at least one contact section is arranged between two sections of a gate electrode arranged in the same trench and is connected to the source metallization. The two sections of the gate electrode are separated from one another in a region of the contact section. At least one of the two sections of the gate electrode arranged in the same trench is electrically connected to a gate electrode arranged in a further trench by way of a gate connecting electrode.

19 Claims, 11 Drawing Sheets

> US 11,810,958 B2

TRANSISTOR COMPONENT HAVING GATE ELECTRODES AND FIELD ELECTRODES

TECHNICAL FIELD

This description relates to a transistor component comprising gate electrodes and field electrodes which are arranged in common trenches of a semiconductor body.

BACKGROUND

A power transistor component, such as a power MOSFET (Metal Oxide Semiconductor Field-Effect Transistor), for example, can comprise a plurality of gate electrodes, which are in each case arranged in a trench of a semiconductor body and connected to a common gate node. Field electrodes can additionally be arranged within the gate electrodes in the same trenches, said field electrodes being connected to a source electrode arranged above the semiconductor body. For the purpose of connecting the field electrode to the source electrode, the field electrodes can comprise terminal regions extending upward in the direction of the source electrode, wherein each terminal region subdivides the overlying gate electrode into two electrode sections.

Each field electrode usually comprises a plurality of terminal regions in order that the field electrodes are connected to the source electrode with the lowest possible resistance. As a result, the gate electrodes are each subdivided into a plurality of electrode sections, wherein each of said electrode sections is to be connected to the gate node. For this purpose, a plurality of conductors (which are usually referred to as gate fingers) can be provided above the semiconductor body, said conductors being connected to the gate node (gate pad). However, providing said gate fingers necessitates a corresponding structuring of the source electrode, that is to say realizing the source electrode with a plurality of electrode sections in order to ensure a separation of the gate fingers from the source electrode. Furthermore, below the gate fingers it is usually not possible to provide active regions, such as source regions, for example, with the consequence that providing gate fingers reduces the active component area for a given area of the semiconductor body.

SUMMARY

An example relates to a transistor component. This transistor component comprises a plurality of gate electrodes and a plurality of field electrodes, wherein in each case one of the plurality of gate electrodes and one of the plurality of field electrodes are arranged one above another in a vertical direction in a common trench of a semiconductor body (100), a gate pad, to which the plurality of gate electrodes are connected, and a source metallization arranged above the semiconductor body. The plurality of field electrodes comprise a first group of field electrodes, wherein the field electrodes of the first group comprise at least one contact section, wherein the at least one contact section is arranged between two sections of a gate electrode arranged in the same trench and is connected to the source metallization. The two sections of the gate electrode are separated from one another in the region of the contact section, and at least one of the two sections of the gate electrode arranged in the same trench is electrically connected to a gate electrode arranged in a further trench by way of a gate connecting electrode.

Examples are explained below with reference to drawings. The drawings serve to illustrate specific principles, and so only aspects required for understanding these principles are illustrated. The drawings are not true to scale.

BRIEF DESCRIPTION OF THE DRAWINGS

In the drawings, the same reference signs designate identical features. It goes without saying that the features of the various exemplary embodiments described herein can be combined with one another, unless explicitly indicated otherwise.

DETAILED DESCRIPTION

Figure 1:
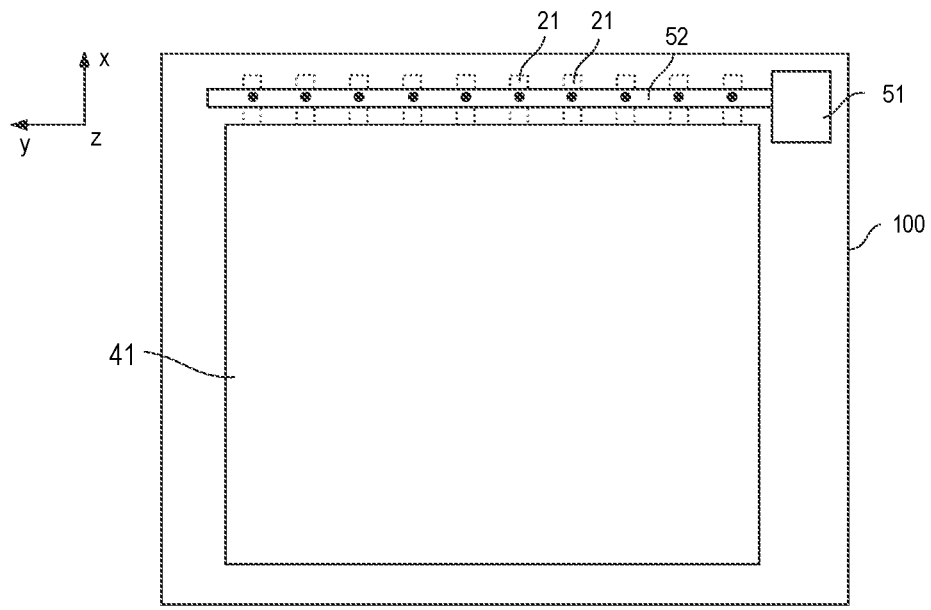
FIG. 1 schematically shows a plan view of a transistor component comprising a plurality of gate electrodes.

In the drawings, the same reference signs designate identical features. It goes without saying that the features of the various exemplary embodiments described herein can be combined with one another, unless explicitly indicated otherwise.

FIG. 1 schematically shows a plan view of a transistor component in accordance with one example. This transistor component comprises a plurality of gate electrodes 21 arranged in each case in a trench of a semiconductor body 100, a gate pad 51, to which the gate electrodes 21 are electrically connected, and a source metallization (often also referred to as source pad) 41. In the example illustrated in FIG. 1, the gate pad 51 and the source metallization 41 are arranged above a first side (which can also be referred to as first main side or front side) of the semiconductor body 100. The gate electrodes 21 can be embodied in each case as elongated electrodes, the longitudinal direction of which corresponds for example to a first lateral direction x of the semiconductor body 100. As is illustrated in FIG. 1, the source electrode 41 can be arranged above the gate electrodes 21, wherein the gate electrodes 21 extend beyond the source electrode 41 in their longitudinal direction and can be connected to the gate pad 51 in the regions in which they extend beyond the source electrode 41.

For the purpose of connecting the gate electrodes 21 to the gate pad 51, the transistor component in accordance with one example comprises at least one gate runner 52 arranged above such regions of the gate electrodes 51 in which the gate electrodes 21 extend beyond the source metallization 41. The gate runner 52 can be connected to the gate electrodes 21 by way of electrically conductive vias extending in a vertical direction z of the semiconductor body 100 proceeding from the gate runner 52 as far as the gate electrodes 21. The vertical direction z of the semiconductor body 100 is a direction running perpendicular to the plane of the drawing illustrated in FIG. 1. The vias are not visible in the illustration in accordance with FIG. 1; the position of said vias is illustrated by dots on the gate runner 52.

Insulation layers or passivation layers can be present between the gate electrodes 21 and the gate runner 52, the electrically conductive vias extending through said layers. Such insulation layers or passivation layers are not illustrated in FIG. 1. The dotted illustration of the gate electrodes 21 in FIG. 1 takes account of the fact that such layers can be present, with the consequence that the gate electrodes 21 are not visible in the plan view of the gate runner 52.

The gate runner 52 is arranged in a manner spaced apart from the source metallization 41, wherein an insulation layer (not illustrated) can be present between the gate runner 52 and the source metallization 41. The gate runner 52 and the source metallization 41 can be produced on the basis of the same metallization layer, which is deposited over the whole area and is structured in order to form the source metallization 41 and the gate runner 52.

In the example shown in FIG. 1, the transistor component comprises a single gate runner 52 proceeding from the gate pad 51 and extending along one side of the source metallization 41. However, this is just one of a number of possible embodiments. In accordance with a further example, illustrated in FIG. 2, the transistor component comprises a gate runner 52 having two sections which each adjoin the gate pad 51 and each extend along opposite sides of the source metallization 41. In this example, the gate electrodes 21 extend beyond the source metallization 41 at the two opposite sides of the source metallization 41 along which the gate runners 52 extend. In this case, the gate electrodes 21 are connected to a respective one of the two gate runners 52 at each of the two longitudinal sides. The gate runners 52 are connected to the gate electrodes 21 by means of electrically conductive vias, for example, which, proceeding from the gate runners 52, extend downward in the vertical direction of the semiconductor body 100, as has already been explained in association with FIG. 1.

In the example in accordance with FIG. 1, the gate pad 51 is arranged in the region of a corner of the semiconductor body 100. In this example the gate runner 52 is elongated and in its longitudinal direction extends in a second lateral direction y of the semiconductor body 100, wherein the second lateral direction y runs perpendicular to the first lateral direction x. This is just one example, however. As in the example in accordance with FIG. 2, in which the gate pad 51 is arranged between two corners of the semiconductor body 100 and the gate runners 52 are angular in a plan view and run around the corner, in the example in accordance with FIG. 1, too, the gate pad could be arranged in a manner spaced apart from the corners and an angular gate runner 52 could be used.

Figure 2:
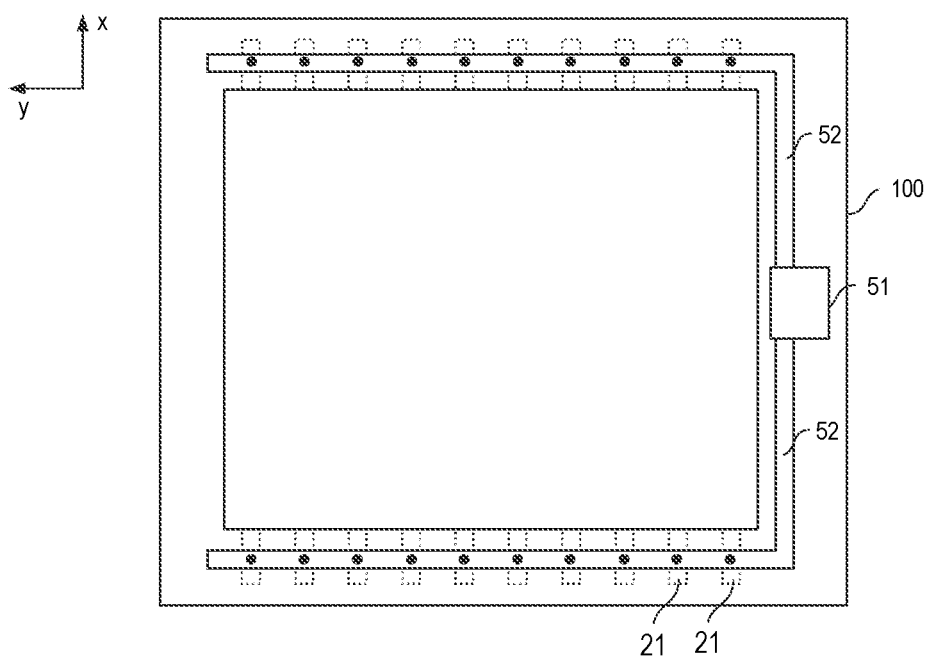
FIGS. 2 and 3 show modifications of the component in accordance with FIG. 1.
Figure 3:
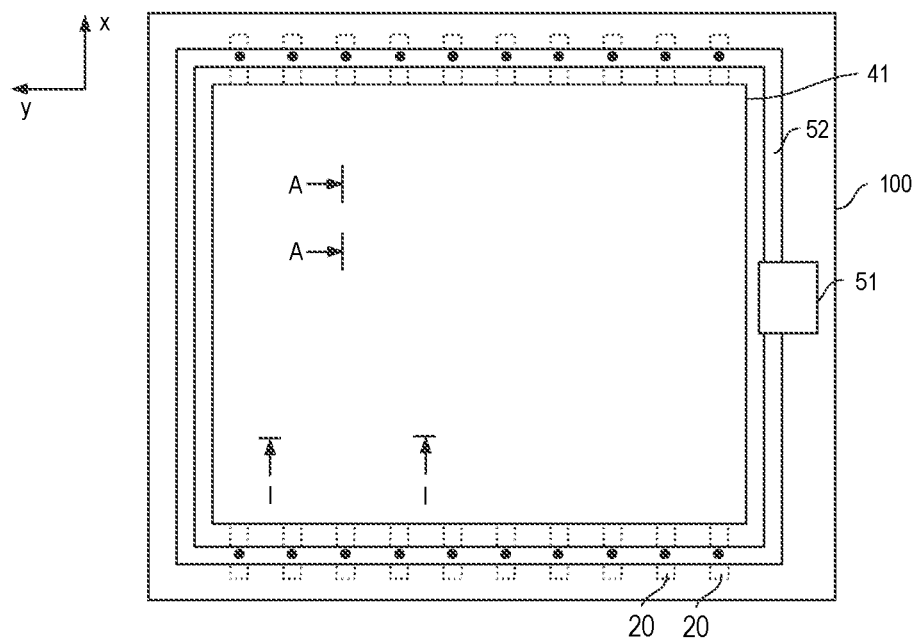

FIG. 3 shows a modification of the transistor components illustrated in FIGS. 1 and 2. In the transistor component in accordance with FIG. 3, one gate runner 52 is present, which runs around the source metallization 41 in a ring-shaped manner and which is connected to the gate pad 51 at two locations. As in the transistor component in accordance with FIG. 2, the gate runner 52 contacts the gate electrodes 21 in each case at opposite longitudinal ends of the gate electrodes 21.

As is illustrated in the examples in accordance with FIGS. 1 to 3, the source metallization 41 can be a large-area metallization arranged above a region of the semiconductor body 100 which comprises the so-called cell array of the transistor component. Active component regions, such as source and body regions, for example, are arranged in said cell array, which will also be explained below. The source metallization 41 can occupy for example an area that is in a range of 70% to 95% of the total area of the semiconductor body 100.

The transistor component additionally comprises a plurality of field electrodes 31, wherein in each case one of the plurality of gate electrodes 21 and one of the plurality of field electrodes 31 are arranged one above another in the vertical direction z of the semiconductor body in a common trench of the semiconductor body 100. This is illustrated schematically in FIG. 4 for one of the gate electrodes 21 and one of the field electrodes 31.

Figure 4:
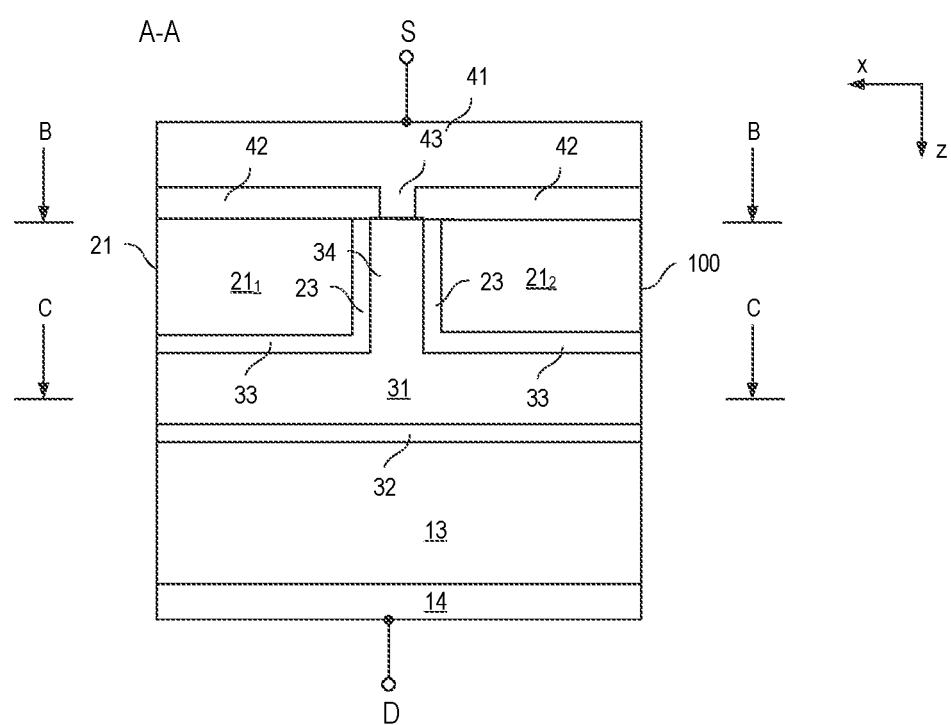
FIG. 4 schematically shows a vertical cross-sectional illustration of a section of a field electrode and of a gate electrode of the transistor component in a region in which the field electrode comprises a contact section.

FIG. 4 shows a vertical sectional view of a section of the transistor component in a vertical sectional plane A-A, which runs in the first lateral direction x and the vertical direction z and which intersects a gate electrode 21 and an underlying field electrode 31. As is illustrated in FIG. 4, the field electrode 31 is insulated from the semiconductor body 100 by a first insulation layer 32, which is also referred to hereinafter as field electrode insulation layer or field electrode dielectric layer. In addition, the field electrode 31 within the trench is insulated from the gate electrode 21 by a second insulation layer 33.

Referring to FIG. 4, the field electrode 31 additionally comprises a contact section 34, by way of which the field electrode 31 is connected to the source metallization 41. The contact section 34, proceeding from the field electrode 31, extends through the gate electrode 21 in the vertical direction z and in this way subdivides the gate electrode 21 into two separate gate electrode sections $21_1, 21_2$. The contact section 34 is insulated from the gate electrode 21 by a third insulation layer 23. The first, second and third insulation layers 32, 33, 23 each comprise for example an oxide, a nitride, or the like.

The contact section 34 of the field electrode 31 is electrically conductively connected to the source metallization 41. In the example illustrated in FIG. 4, the source metallization 41 is connected to the contact section 34 by an electrically conductive via 43, which, proceeding from the source metallization 41, extends in the vertical direction z through a further insulation layer 42 as far as the contact section 34. The further insulation layer 42 electrically insulates the gate electrode 21 from the source metallization 41.

Both in the case of a transistor component in accordance with FIG. 1, in which the gate electrodes 21 are connected to the gate runner 52 only at one longitudinal end, and in the case of the transistor components in accordance with FIGS. 2 and 3, in which the gate electrodes 21 are connected to the gate pad 51 at both opposite longitudinal ends by way of one or two gate runners 52, it may be desirable to electrically conductively connect together the two gate electrode sections $21_1$, $21_2$ separated from the contact section 34 of the field electrode 31 below the source metallization 41. One example of how the two gate electrode sections $21_1$, $21_2$ separated from one another by the contact section 34 can be electrically connected to one another is illustrated in FIG. 5.

Figure 5:
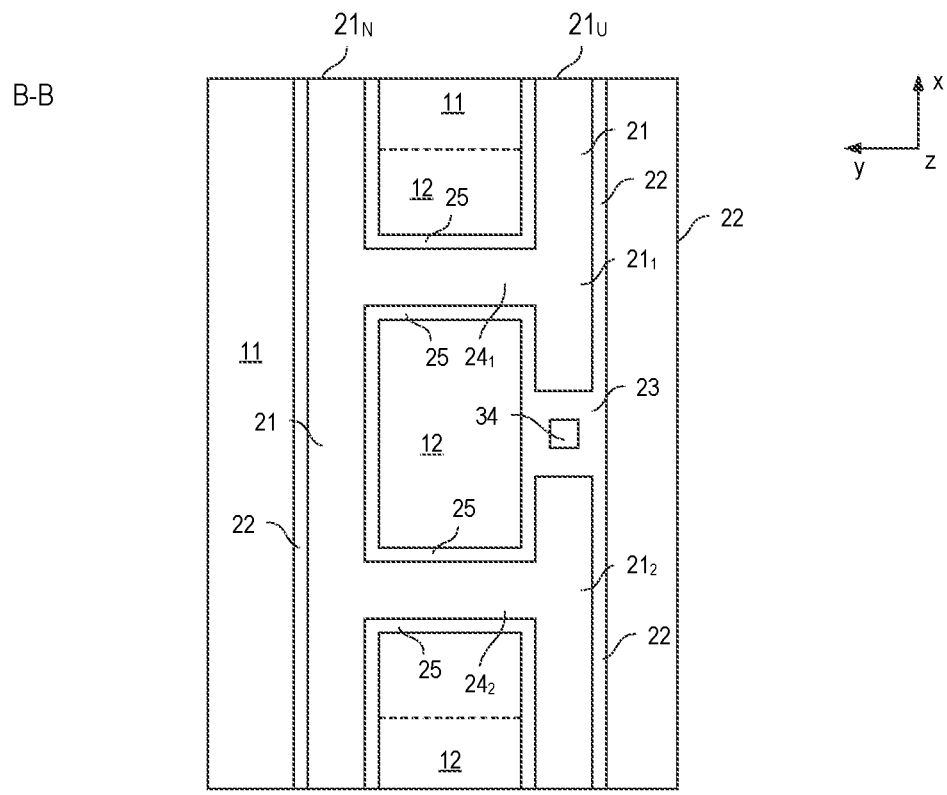
FIG. 5 schematically shows a horizontal cross-sectional illustration of a gate electrode interrupted by a contact section of a field electrode, wherein sections of the interrupted gate electrode are connected to one another by connecting electrodes and an adjacent gate electrode.

FIG. 5 shows a horizontal sectional view of the transistor component in a sectional plane B-B in the region of the contact section 34. Said sectional plane B-B runs in both horizontal directions x, y, and thus parallel to the front side of the semiconductor body 100, and intersects the gate electrodes 21 in the illustrated section. As is illustrated in FIG. 5, the two sections $21_1$, $21_2$ of the gate electrode 21, which is also referred to hereinafter as gate electrode $21_U$ interrupted in its structure, are electrically connected to one another by way of gate connecting electrodes $24_1$, $24_2$ and at least one gate electrode 21 arranged in a further trench. The further trench can be a trench which is adjacent to the trench with the structurally interrupted gate electrode $21_U$, and is also referred to hereinafter as adjacent trench. The gate electrode arranged in said further trench is also referred to hereinafter as further gate electrode or adjacent gate electrode $21_N$. In accordance with one example, the interrupted gate electrode $21_U$ and the further gate electrode $21_N$ extend parallel to one another and in the same direction.

The gate electrodes 21 are insulated from the semiconductor body 100 by a respective gate dielectric 22, which will also be explained below. The gate connecting electrodes $24_1$, $24_2$ are insulated from the semiconductor body by insulation layers 25 and are electrically conductively connected to the gate electrode sections $21_1$, $21_2$ of the interrupted gate electrode $21_U$ and the adjacent gate electrode $21_N$, wherein a first gate connecting electrode $24_1$ is connected to the first section $21_1$ of the interrupted gate electrode $21_U$, and thus connects said first section $21_1$ to the adjacent gate electrode $21_N$, and a second gate connecting electrode $24_2$ is connected to the second section $21_2$ of the interrupted gate electrode $21_U$, and thus connects the second section $21_2$ to the adjacent gate electrode $21_N$. In this way, the two sections $21_1$, $21_2$ of the interrupted gate electrode $21_U$ are conductively connected to one another by the two gate connecting electrodes $24_1$, $24_2$ and that section of the adjacent gate electrode $21_N$ which is arranged between the two gate connecting electrodes $24_1$, $24_2$.

Figure 6:
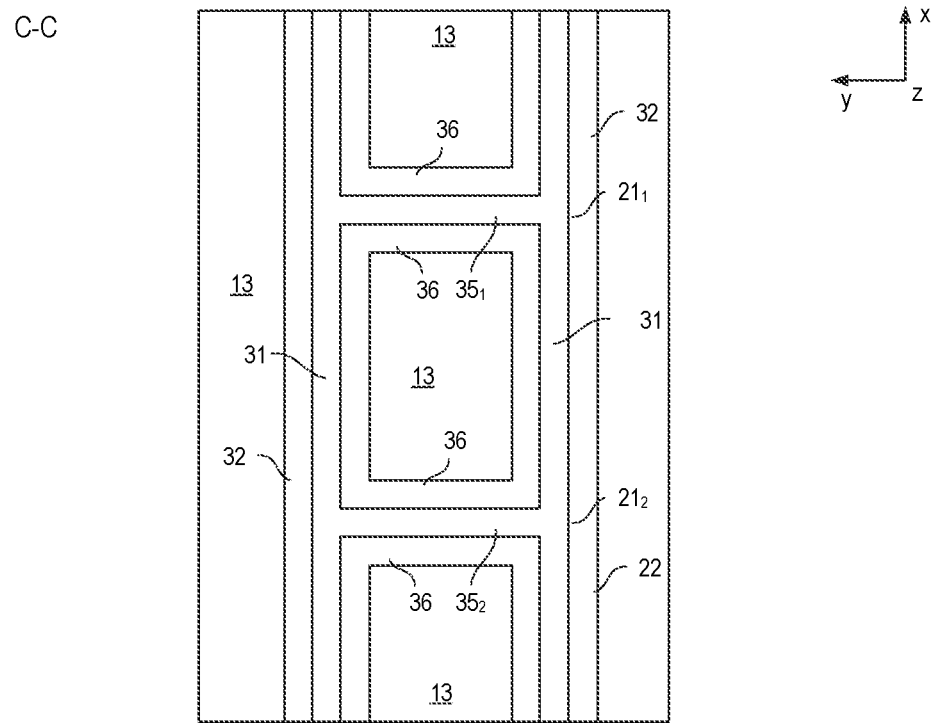
FIG. 6 schematically shows a horizontal cross-sectional illustration of one example of a field electrode arrangement which is arranged below the arrangement with the two gate electrodes in accordance with FIG. 5.

In the variant illustrated in FIG. 5, in which the gate connecting electrodes $24_1$, $24_2$ are arranged in trenches, the field electrode 31 arranged below the interrupted gate electrode $21_U$ and the field electrode 31 arranged below the adjacent gate electrode $21_N$ can be electrically conductively connected to one another by corresponding field electrode connecting electrodes $35_1$, $35_2$, as is illustrated in FIG. 6.

FIG. 6 shows a horizontal sectional view of that section of the transistor component which is illustrated in FIG. 5, in a sectional plane C-C illustrated in FIG. 4, said sectional plane cutting through the field electrodes 31 arranged below the interrupted gate electrode $21_U$ and the adjacent gate electrode $21_N$. In the example illustrated in FIG. 6, in each trench in which one of the gate connecting electrodes $24_1$, $24_2$ is arranged a corresponding field electrode connecting electrode $35_1$, $35_2$ is present below the gate connecting electrodes $24_1$, $24_2$. This is just one example, however. In principle, a single field electrode connecting electrode is sufficient for electrically connecting the two adjacent field electrodes 31, such that in accordance with one example (not illustrated) only one of the two field electrode connecting electrodes $35_1$, $35_2$ is present.

A connection of adjacent field electrodes 31 by connecting electrodes $35_1$, $35_2$ arranged below the gate connecting electrodes $24_1$, $24_2$, as is shown in FIG. 6, is just one example, however. In accordance with a further example, illustrated in FIG. 7, there is also a possibility of only the interrupted gate electrode $21_U$ and the adjacent gate electrode $21_N$ being connected to one another, but not also the field electrodes 31 arranged below these gate electrodes $21_U$, $21_N$.

Figure 7:
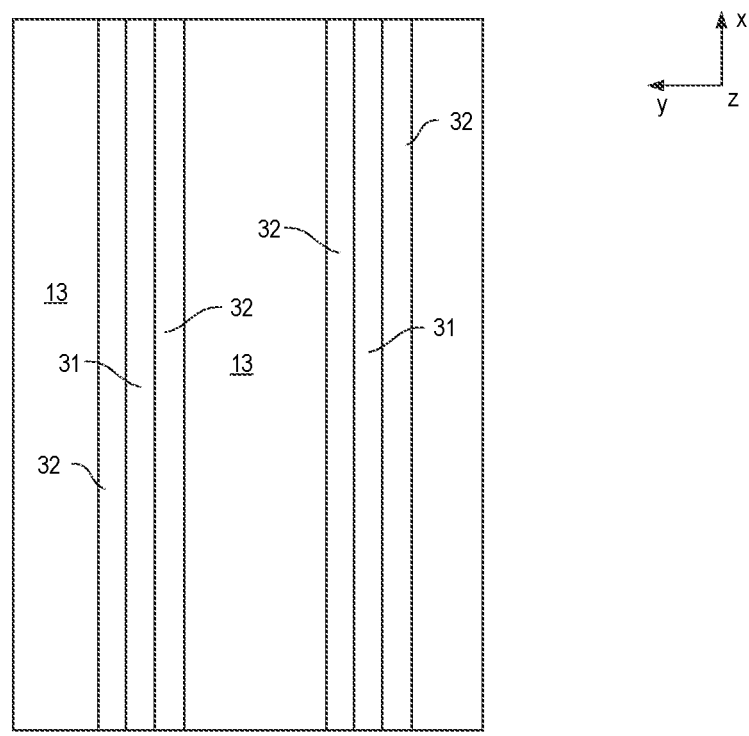
FIG. 7 schematically shows a horizontal cross-sectional illustration of a further example of a field electrode arrangement which is arranged below the arrangement with the two gate electrodes in accordance with FIG. 5.

FIG. 7 shows a sectional illustration of that excerpt from the transistor component which is illustrated in FIG. 5, in the sectional plane C-C for an example in which the field electrodes 31 below the gate electrodes $21_U$, $21_N$ are not connected to one another. These two field electrodes 31 are (a) either connected to one another elsewhere by way of connecting electrodes running in each case transversely with respect to the longitudinal directions of the field electrodes 31 or (b) not connected to one another by connecting electrodes within the semiconductor body, and thus connected to the source metallization 41 only by way of one or more contact sections of the type illustrated in FIG. 4. In accordance with one example, the gate connecting electrodes 24 can be arranged such that all trenches in which gate electrodes 21 are arranged are crossed, as is illustrated for example in FIGS. 14A-15B, which will also be explained below. The semiconductor body 100 typically comprises a multiplicity of trenches, for example more than 500 trenches, with gate electrodes 21 arranged therein.

In accordance with one example, the transistor component additionally comprises in the semiconductor body 100 a plurality of source regions 11, a plurality of body regions 12, at least one drift region 13 and at least one drain region 14. One example of how these component regions, which can also be referred to as active component regions, are arranged within the semiconductor body 100 is illustrated in FIGS. 8A-8C.

Figure 8A:
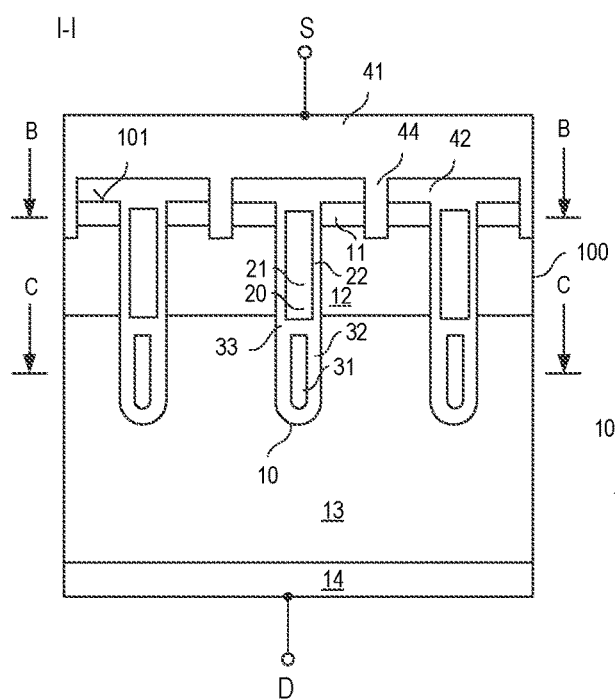
FIGS. 8A-8C schematically show various cross-sectional illustrations of one example of a transistor component comprising a plurality of gate electrodes and a plurality of field electrodes, wherein in each case one gate electrode and one field electrode are arranged in a common trench.
Figure 8B:
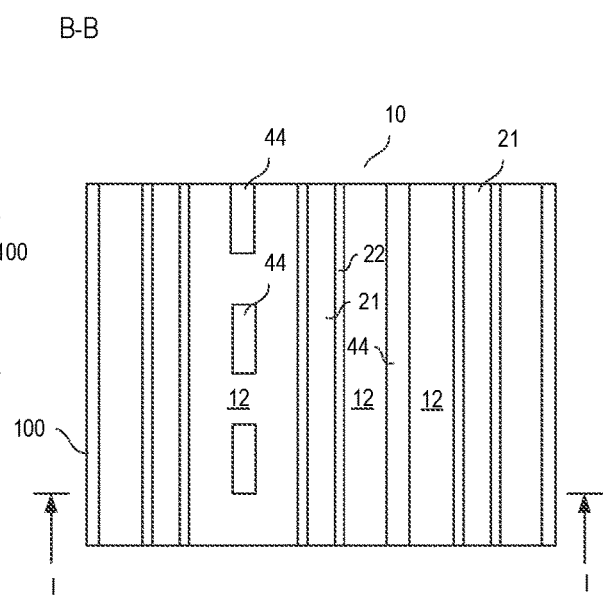
Figure 8C:
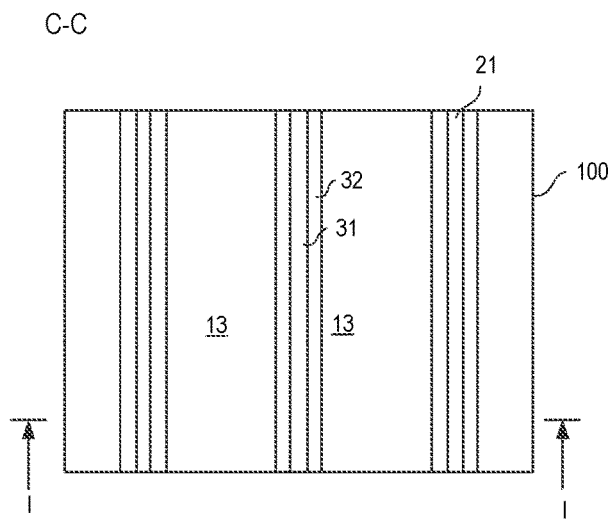

FIGS. 8A-8C illustrate an excerpt from the transistor component in a vertical sectional plane I-I running perpendicular to the longitudinal directions of the gate electrodes 21 and the field electrodes 31 (FIG. 8A), in the first horizontal sectional plane B-B, already explained above, which intersects the gate electrodes 21, (FIG. 8B) and in the second horizontal sectional plane C-C, already explained above, which intersects the field electrodes 31, (FIG. 8C).

Referring to FIG. 8A, the drift region 13 is arranged adjacent to the field electrodes 31 and is insulated from the field electrodes 31 dielectrically by the field electrode dielectrics 32. The body regions 12 adjoin the drift region 13, are arranged adjacent to the gate electrodes 21 and are insulated from the gate electrodes 21 dielectrically by gate dielectrics 22. The source regions 11 adjoin the body regions 12 and are separated from the drift region 13 by the body regions 12. The at least one drain region 14 is arranged in a manner spaced apart from the body regions 12 in the vertical direction of the semiconductor body 100, wherein the drift region 13 is arranged between the body regions 12 and the drain region 14. The drain region 14 can adjoin the drift region 13, as is illustrated in FIG. 8A. Optionally, a field stop region (not illustrated), which is of the same conduction type as the drift region 13 and is more highly doped than the drift region 13, is arranged between the drain region 14 and the drift region 13. The transistor component in accordance with FIG. 8A, in which the source regions 11 are spaced apart from the drain region in the vertical direction of the semiconductor body 100, can also be referred to as a vertical transistor.

The drift region 13 is of a first conduction type (n-type or p-type) and the body regions 12 are of a second conduction type (p-type or n-type) complementary to the first conduction type, such that a pn junction is in each case formed between the body regions 12 and the drift region 13. The source regions 11 are of the same conduction type as the drift region 13.

The transistor component can be realized as an n-conducting transistor component or as a p-conducting transistor component. In the case of an n-conducting transistor component, the component regions of the first doping type are n-doped and the component regions of the second conduction type are p-doped. In the case of a p-conducting transistor component, the component regions of the first doping type are p-doped and the component regions of the second doping type are n-doped. The transistor component can be realized as a MOSFET. In this case, the drain region 14 is of the same conduction type as the drift region 13 and as the source regions 11. In accordance with a further example, the transistor component is realized as an IGBT. In this case, the drain region 14 is doped complementarily to the drift region 13 and the source regions 11.

The semiconductor body 100 can comprise a conventional (monocrystalline) semiconductor material, such as, for example, silicon (Si), silicon carbide (SiC), gallium arsenide (GaAs) or gallium nitride (GaN). In accordance with one example, the semiconductor body 100 comprises monocrystalline silicon. In this case, the doping concentrations of the individual component regions are for example within the doping ranges indicated hereinafter: source regions 11: $1E19$ $cm^{-3}$-$1E21$ $cm^{-3}$; body regions 12: $1E17$ $cm^{-3}$-$1E18$ $cm^{-3}$; drift region 13: $1E15$ $cm^{-3}$-$5E17$ $cm^{-3}$; drain region 14: $1E19$ $cm^{-3}$-$1E20$ $cm^{-3}$.

As is illustrated in FIG. 8A, the source regions 11 are connected to the source metallization 41 by way of terminal contacts 44, which can also be referred to as source vias. Said terminal contacts 44, proceeding from the source metallization 41, extend through the insulation layer 42 as far as the source regions 11 or right into the source regions 11. As is illustrated in FIG. 8A, the body regions 12 can also be connected to the source metallization 41. This can be achieved for example by virtue of the terminal contacts 44 extending through the source regions 11 in the vertical direction of the semiconductor body 100 right into the body regions 12, as is illustrated in FIG. 8A. In the region in which the body regions 12 are contacted by the terminal contacts 44, said body regions can comprise a contact region (not illustrated in FIG. 8A) that is more highly doped than other sections of the body regions 12, wherein the contact region serves to produce an ohmic contact between the terminal contacts 44 and the body regions 12.

As is illustrated in FIG. 8B, the terminal contacts 44 can be elongated contacts running parallel to the longitudinal directions of the gate electrodes 21. In accordance with a further example, likewise illustrated in FIG. 8B, each source metallization 41 can be connected by way of a plurality of terminal contacts 44 to the source metallization 41, wherein said plurality of terminal contacts 44 are arranged in a manner spaced apart from one another in the longitudinal direction of the source regions 11. The longitudinal direction of the source regions 11 corresponds to the longitudinal direction of the gate electrodes 21.

The gate electrodes 21 are connected to the gate pad 51 in the manner already explained above, said gate pad forming a gate terminal of the component. The drain region 14 forms a drain terminal D (only illustrated schematically) of the transistor component or is connected to the drain terminal D. The source metallization 41 forms a source terminal S (only illustrated schematically) or is connected to the source terminal S of the transistor component.

The transistor component can be controlled in the conventional manner by a suitable control voltage being applied between the gate terminal G and the source terminal S, and thus between the gate electrodes 21 and the source regions 11. The component is turned on when the control voltage produces conducting channels in the body regions 12 between the source regions 11 and the drift region 13, and is turned off when said conducting channels are interrupted. With the component having being controlled to the on state, when a suitable voltage is applied between the drain terminal D and the source terminal S, a current can flow between these two terminals D, S. The component is turned off when, on account of the control voltage, there are no conducting channels present in the body regions 12 along the gate dielectrics and a voltage present between the drain terminal D and the source terminal S reverse-biases the pn junctions between the drift region 13 and the body regions 12. In this case, proceeding from the pn junctions, a space charge zone propagates and is accommodated by the ionization of dopant atoms in the drift region 13. With the component in the off state, the field electrodes 31 connected to the source S bring about, in a conventional manner, a partial compensation of the charge carriers brought about by the ionization. The drift region 13 can thus be more highly doped in comparison with a component of the same dielectric strength which does not comprise field electrodes, as a result of which it has a lower on resistance. The "dielectric strength" is the maximum voltage that can be applied between drain D and source S with the component in the off state, without a voltage breakdown occurring.

The drift region 13 and the drain region 14 are also illustrated in FIG. 4, already explained above. The source regions 11 are also illustrated in FIG. 5, and sections of the at least one drift region 13 are illustrated in FIGS. 6 and 7.

A region of the transistor component in which the interrupted gate electrode $21_U$ (cf. FIG. 5) comprises a contact section 34 and in which the gate connecting electrodes $24_1$, $24_2$ are arranged is also referred to hereinafter as contact region. FIG. 8A shows a cross section of the transistor component outside such a contact region. As is illustrated in FIG. 5, source regions 11 can also be arranged in the contact region, that is to say can also extend in the contact region as far as the gate dielectrics 22 and can be arranged between the two gate connecting electrodes $24_1$, $24_2$. This is just one example, however.

Figure 9:
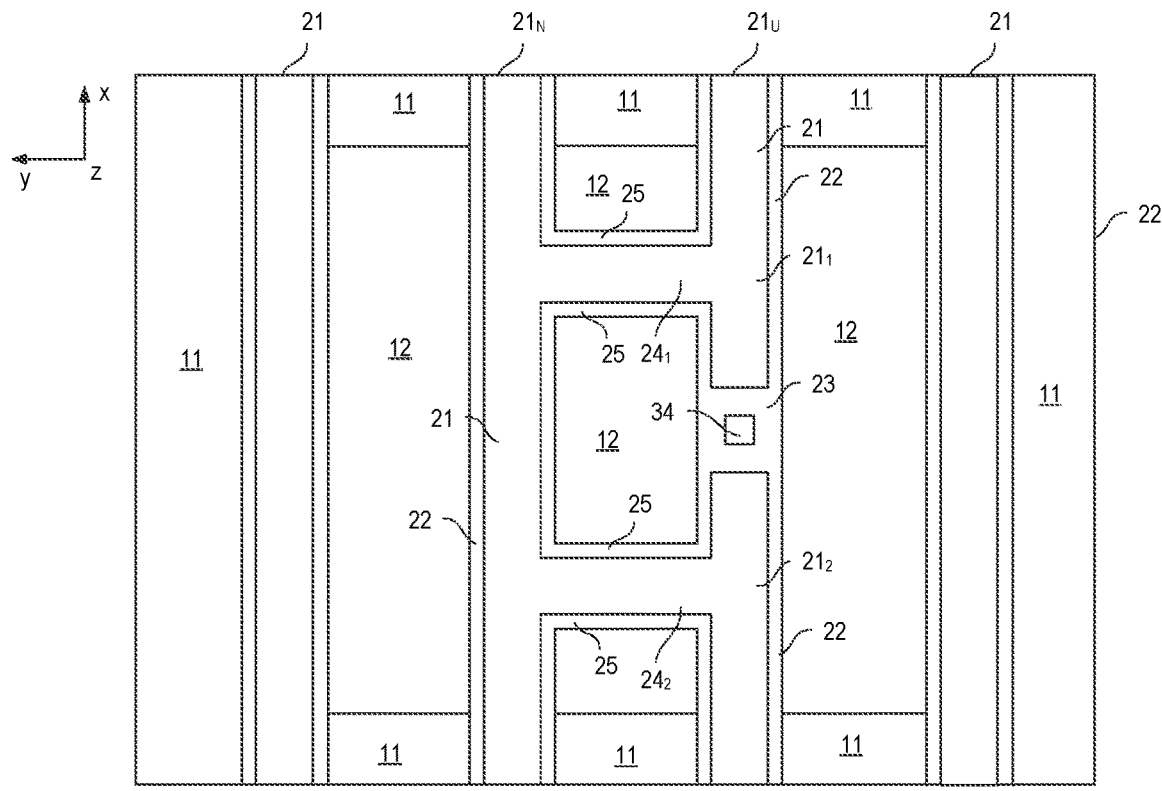
FIG. 9 shows a modification of the component illustrated in FIG. 5.

In accordance with a further example, illustrated in FIG. 9, there is also the possibility of omitting the source regions 11 in the contact region, such that in this region the body regions 12 extend as far as the front side of the semiconductor body. In this case, the source regions 11 are arranged in a manner spaced apart from the gate connecting electrodes $24_1$, $24_2$ in the longitudinal direction of the gate electrodes 21, that is to say in the first lateral direction x of the semiconductor body. Furthermore, the source regions 11 are also omitted in such sections of the contact region which adjoin the interrupted gate electrode $21_U$ and the adjacent gate electrode $21_N$ in the second lateral direction y. In the contact region, therefore, there are no source regions 11 present between the interrupted gate electrode $21_U$ and the adjacent gate electrode $21_N$ and between the interrupted gate electrode $21_U$ and the adjacent gate electrode $21_N$ and the gate electrodes 21 respectively adjacent to these gate electrodes $21_U$, $21_N$.

Figure 10:
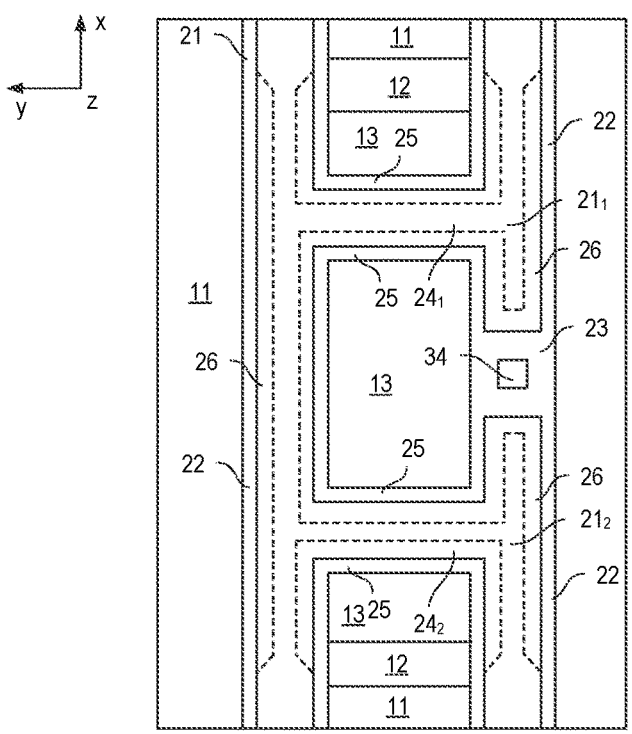
FIG. 10 shows a further modification of the component illustrated in FIG. 5.

In a further example, illustrated in FIG. 10, the body regions 12 are also omitted in the contact region. In this case, the drift region 13 extends in the contact region as far as the front side of the semiconductor body 100. In order that the gate electrodes 21 in this region are protected against excessively high voltages with the component in the off state, the gate dielectric 22 in this region can be replaced by an insulation layer 26 which is thicker than the gate dielectric 22 and the thickness of which corresponds for example to the thickness of the field electrode dielectric 32. This thick insulation layer is designated by the reference sign 26 in FIG. 10.

FIGS. 4-7, 9 and 10 show for explanation purposes only one interrupted gate electrode $21_U$, one contact section 34 interrupting the gate electrode $21_U$, and the contact region in which said contact section 34 is arranged. A plurality of such contact regions can be present within the component, wherein a field electrode can also be connected to the source metallization 41 by way of a plurality of contact sections 34, such that the overlying gate electrode is interrupted at more than one location and thus comprises more than two gate electrode sections. If n is generally the number of contact sections comprised by a field electrode, then the gate electrode interrupted by these contact sections comprises n+1 gate electrode sections.

Various examples are explained below, wherein only horizontal cross sections in which the gate electrodes 21, the gate connecting electrodes 24 and the contact sections 34 are illustrated are shown hereinafter for reasons of clarity. Other regions of the transistor component are not illustrated in these schematic views.

Figure 11:
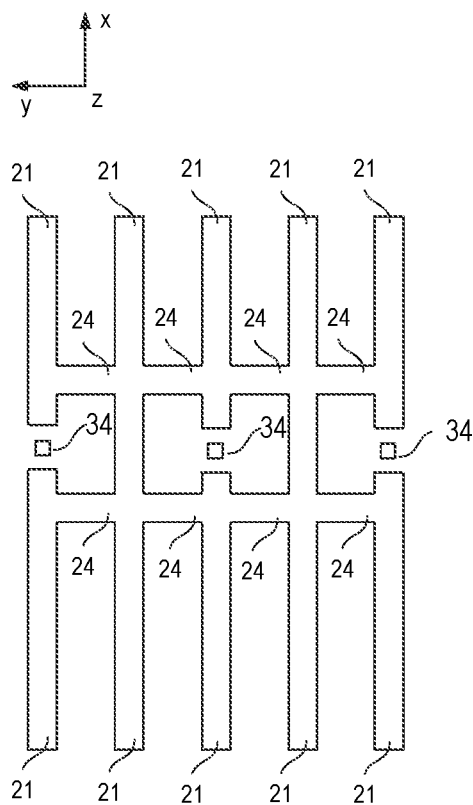
FIG. 11 schematically shows a horizontal cross-sectional illustration of a plurality of adjacent gate electrodes, some of which are interrupted by contact sections of field electrodes.

In accordance with one example, illustrated in FIG. 11, provision is made for only every i-th (wherein i=2 holds true in the example) field electrode 31 comprises a contact section 34, wherein these contact sections 34 are arranged approximately on a line in the second lateral direction y of the semiconductor body 100. The interrupted gate electrodes $21_U$ are connected to one another by way of gate connecting electrodes 24 and adjacent gate electrodes $21_N$, wherein interrupted gate electrodes $21_U$ and non-interrupted adjacent gate electrodes $21_N$ are present alternately in the example in accordance with FIG. 11. In this example the gate connecting electrodes 24 together with the gate electrodes 21 form a ladderlike arrangement, the "rungs" of which are formed by sections of the non-interrupted adjacent gate electrodes $21_N$, wherein the contact sections 34 are arranged in each case between two "rungs" of the ladderlike arrangement.

Figure 12:
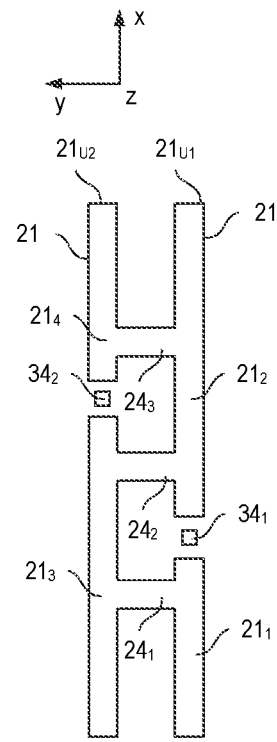
FIG. 12 shows a further example of adjacent gate electrodes in the vicinity of contact sections of field electrodes.

FIG. 12 shows an example in which adjacent field electrodes 31 each comprise a contact section $34_1$, $34_2$, as a result of which two directly adjacent gate electrodes 21 are in each case interrupted, such that a first gate electrode $21_{U1}$ interrupted by a first contact section $34_1$ comprises a first gate electrode section $21_1$ and a second gate electrode section $21_2$ and that a second gate electrode $21_{U2}$ interrupted by a second contact section $34_2$ comprises a third gate electrode section $21_3$ and a fourth gate electrode section $21_4$. In this example, the contact sections $34_1$, $34_2$ are arranged offset with respect to one another in the first lateral direction x, such that the first and second gate electrode sections $21_1$, $21_2$ are connected to one another by way of the third gate electrode section $21_3$ running parallel thereto and a first and a second gate connecting electrode $24_1$, $24_2$, and the third and fourth gate electrode sections $21_3$, $21_4$ are connected to one another by way of the second gate electrode section $21_3$ running parallel thereto and the second and a third gate connecting electrode $24_2$, $24_3$.

Figure 13:
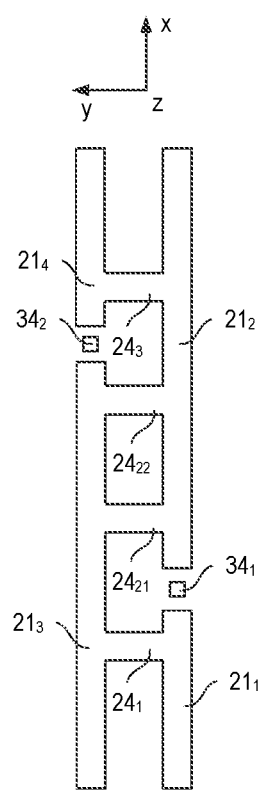
FIG. 13 shows a modification of the arrangement illustrated in FIG. 12.

In the example in accordance with FIG. 12, there are three gate connecting electrodes $24_1$, $24_2$, $24_3$ running substantially parallel to one another. It goes without saying that in the example illustrated in FIG. 12, instead of the second gate connecting electrode $24_2$, two gate connecting electrodes can also be provided, which run parallel to one another and which are arranged in a manner spaced apart from one another in the first lateral direction x. Such an example is illustrated in FIG. 13. The two gate connecting electrode are designated by $24_{21}$ and $24_{22}$ in this example.

Figure 14A:
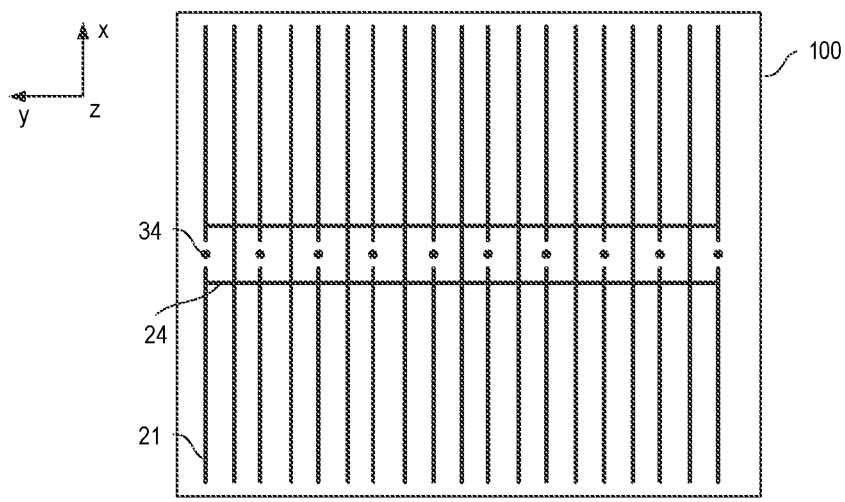
FIGS. 14A-14B, 15A-15B, 16, 17 and 18 illustrate further examples of the realization of contact sections of field electrodes and the connection of individual sections of gate electrodes which are interrupted by one or more contact sections.
Figure 14B:
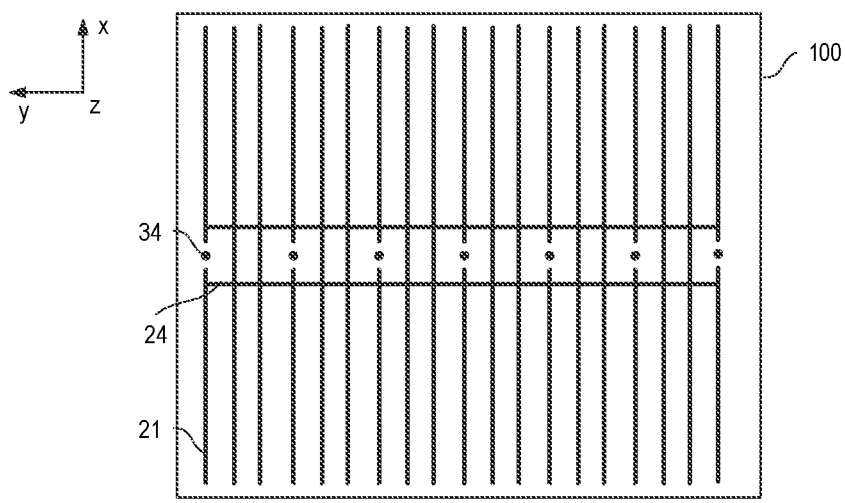

FIG. 14A schematically shows a horizontal sectional view of a transistor component which comprises only contact regions of the type illustrated in FIG. 11, wherein, in the example illustrated in FIG. 14A, every second field electrode comprises a contact section 34, such that every second gate electrode 21 is interrupted or exactly one non-interrupted gate electrode is arranged between two interrupted gate electrodes 21. This is just one example, however. In principle, there is the possibility of only every i-th field electrode 31 being connected to the source metallization 41 by way of a contact section 34, wherein i is an arbitrary integer greater than 1. FIG. 14B shows an example in which every third field electrode 31 comprises a contact section 34 (i.e. i=3), such that every third gate electrode 21 is interrupted or exactly two non-interrupted gate electrodes are arranged between two interrupted gate electrodes 21.

It goes without saying, however, that the field electrodes which are not connected to the source metallization 41 by way of a contact section 34 can nevertheless be electrically connected to the source metallization 41. Those field electrodes which do not comprise contact sections 34 in the examples in accordance with FIGS. 14A and 14B are connected, for example by way of connecting electrodes $35_1$, $35_2$ such as are illustrated in FIG. 6, to such adjacent field electrodes 31 which are connected to source metallization 41 by way of a contact section 34. Of course, the number i can also vary within the component. That is to say that the number of non-interrupted gate electrodes arranged between two respectively interrupted gate electrodes can be different for different pairs of adjacent interrupted gate electrodes. In this regard, therefore, by way of example, in specific sections every second field electrode 31, in specific sections every third field electrode 31 or in other sections only every fourth field electrode 31 can comprise a contact section 34.

Figure 15A:
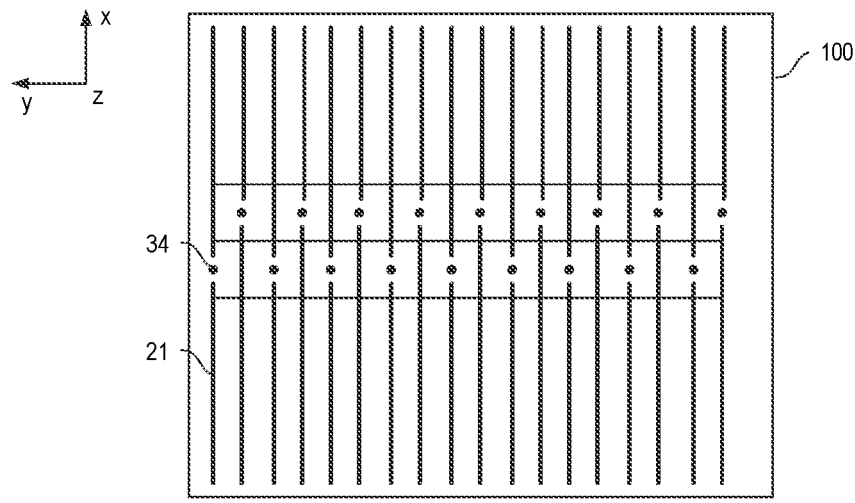
Figure 15B:
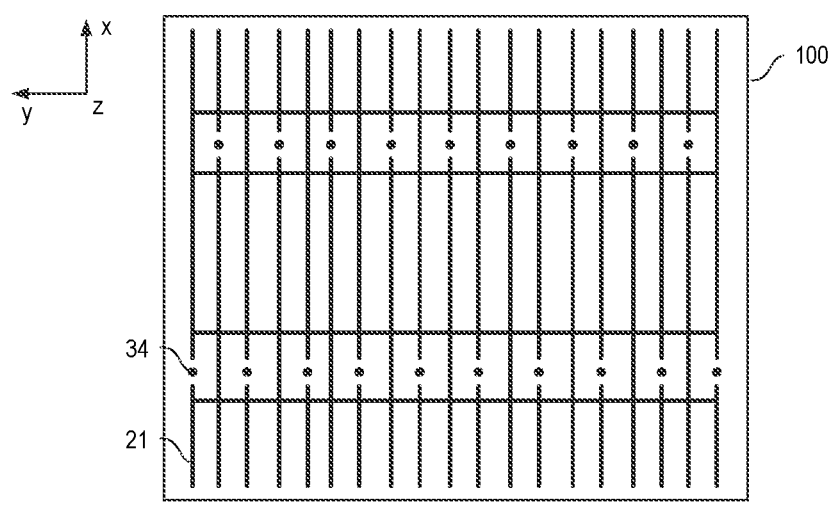

FIG. 15A schematically shows a horizontal sectional view of a transistor component which comprises only contact regions of the type illustrated in FIG. 12, and FIG. 15B schematically shows a sectional view of a transistor component which comprises only contact regions of the type illustrated in FIG. 13.

Figure 16:
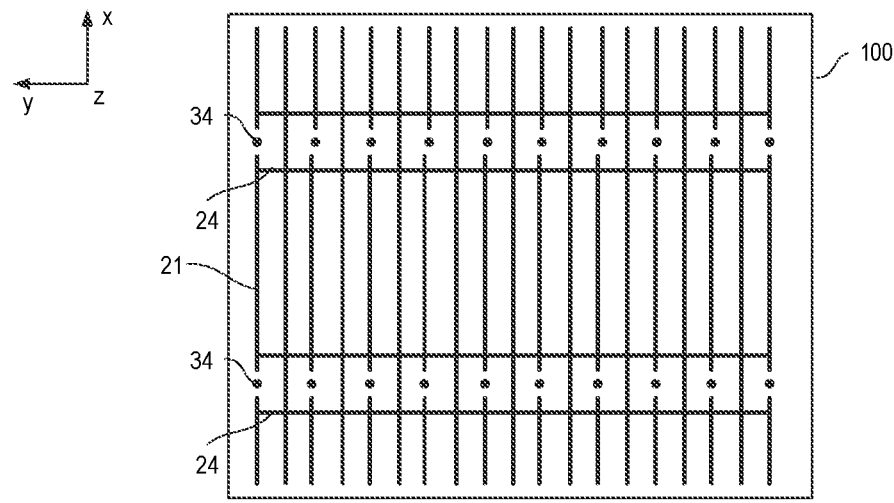

In the examples shown with reference to FIGS. 14A-15B, each field electrode 31 comprises a maximum of one contact section 34. As already explained above, this is just one example, however. FIG. 16 shows an example of a transistor component in which a plurality of field electrodes each comprise two contact sections.

Figure 17:
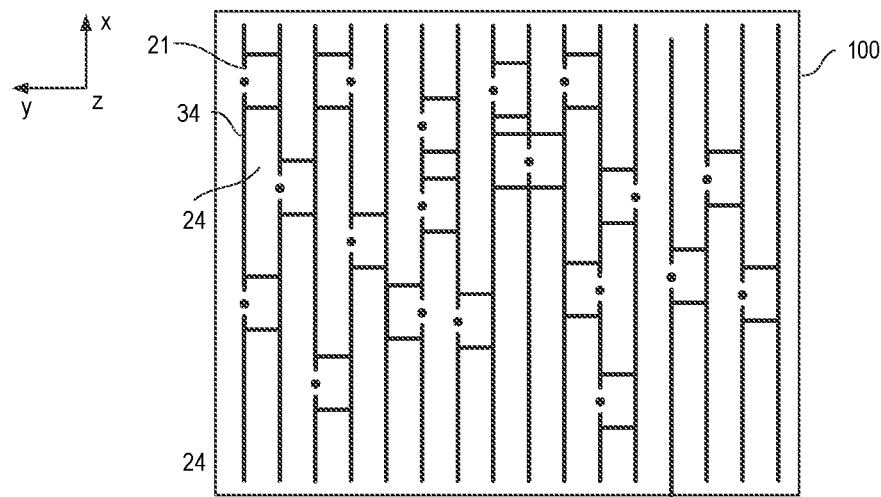

In the example illustrated in FIGS. 14A-16, the contact regions are distributed regularly over the component. This is just one example, however. (a) A number j of the contact sections comprised by each field electrode 32 can be chosen in any desired way for each field electrode within the component. Within a component, therefore, there can be for example one or more field electrodes without a contact section (j=0), one or more field electrodes having exactly one contact section (j=1), one or more field electrodes having exactly two contact sections (j=2). (b) Furthermore, the positions of the contact sections 34 in the longitudinal direction at the individual field electrodes 32 can also be chosen in any desired way. One example of a component having a varying number of contact sections 34 per field electrode and with varying positioning of the contact sections 34 along the longitudinal directions of the individual field electrodes 32 is illustrated in FIG. 17. In this example, the contact sections 34 are arranged in a manner "scattered" arbitrarily.

In the examples explained above, two gate electrode sections of an interrupted gate electrode are electrically connected to one another by way of two gate connecting electrodes and a section of an adjacent gate electrode, wherein a respective one of the gate connecting electrodes is connected to each of the gate electrode sections, wherein both gate connecting electrodes are electrically connected to the section of the adjacent gate electrode. This connection of the two gate electrode sections of an interrupted gate electrode by way of two gate connecting electrodes and a section of an adjacent gate electrode can be effected independently of whether the two gate electrode sections are connected to the gate runner directly, i.e. in the region of a longitudinal end.

If, in the examples in accordance with FIGS. 14A-15B, in which the individual gate electrodes are subdivided maximally into two gate electrode sections, a gate runner 52 of the kind illustrated in FIGS. 2 and 3 is provided, which contacts the individual gate electrodes at opposite ends, then each gate electrode section is directly connected to the gate runner. Nevertheless, connection of the gate electrode sections by way of gate connecting electrodes and sections of one or more adjacent gate electrodes is additionally expedient in order that all sections of the individual gate electrodes are connected to the gate runner with the lowest possible resistance.

In accordance with a further example, provision is made for connecting only one of two gate electrode sections of an interrupted gate electrode to an adjacent gate electrode or a section of an adjacent gate electrode by way of a gate connecting electrode, while the other gate electrode section is connected to the gate runner. One example of such a transistor component is illustrated in FIG. 18.

Figure 18:
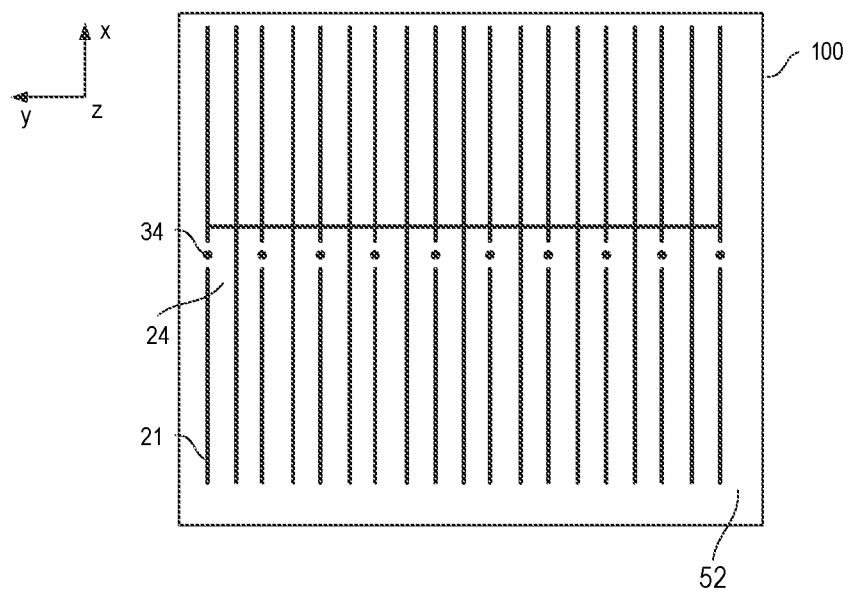

The component in accordance with FIG. 18 is a modification of the component illustrated in FIG. 14A. In this component, only one of two gate electrode sections of an interrupted gate electrode is connected to an adjacent gate electrode, wherein this connecting of the gate electrode section to the adjacent gate electrode can be effected, (a) in order to connect the respective gate electrode section to the gate runner by way of the adjacent gate electrode (if the respective gate electrode section is not directly connected to the gate runner), or (b) in order to connect the respective gate electrode section to the gate runner additionally by way of the adjacent gate electrode (if the respective gate electrode section is already directly connected to the gate runner).

As is illustrated in FIGS. 1 to 3, the gate pad 51 and the source metallization 41 can be arranged above the same side of the semiconductor body 100. This is just one example, however. In accordance with a further example (not illustrated), the source metallization is arranged in the region of a first side of the semiconductor body and the gate pad is arranged in the region of a second side situated opposite the first side, wherein a drain metallization making contact with the drain region can also be arranged in the region of the second side. In this case, the gate runner can be realized in the same way as explained above, that is to say can be arranged in the region of the first side of the semiconductor body, and is connected to the gate pad by way of at least one electrically conductive via extending through the semiconductor body.

It should furthermore be noted that no gate finger structures are required in the exemplary embodiments shown, since the gate electrodes no longer need necessarily be interrupted in order to enable the field electrodes to be contacted. As a result, chip area can be saved and more cost-effective production can be made possible. The source metallization 41 can thus be arranged without interruptions in a region which comprises the active cell array, wherein the gate electrodes 21 are nevertheless electrically connected in a continuous manner (continuously) in a region below the source metallization.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A transistor component, comprising:
   a plurality of gate electrodes and a plurality of field electrodes, wherein in each case one of the plurality of gate electrodes and one of the plurality of field electrodes are arranged one above another in a vertical direction in a common trench of a semiconductor body;
   a gate pad to which the plurality of gate electrodes are connected; and
   a source metallization arranged above the semiconductor body,
   wherein the plurality of field electrodes comprise a first group of field electrodes,
   wherein the field electrodes of the first group comprise at least one contact section,
   wherein the at least one contact section is arranged between two sections of a gate electrode arranged in the same trench and is connected to the source metallization,
   wherein the two sections of the gate electrode are separated from one another in a region of the contact section, and
   wherein at least one of the two sections of the gate electrode arranged in the same trench is electrically connected to a gate electrode arranged in a further trench by way of a gate connecting electrode arranged in a further trench of the semiconductor body.

2. The transistor component of claim 1, wherein each of the two sections of the gate electrode arranged in the same trench is electrically connected to the gate electrode arranged in the further trench by way of a respective gate connecting electrode, such that the two sections are electrically connected to one another by way of the respective gate connecting electrodes and the gate electrode arranged in the further trench.

3. The transistor component of claim 1, wherein the trenches run at least approximately parallel, and wherein the gate connecting electrode runs at least approximately perpendicular to a longitudinal direction of the trenches.

4. The transistor component of claim 1, wherein each of the plurality of field electrodes comprises at least one contact section.

5. The transistor component of claim 1, wherein the trenches run at least approximately parallel, wherein the gate connecting electrode runs at least approximately perpendicular to a longitudinal direction of the trenches, and wherein at least one further connecting electrode and the gate connecting electrode are arranged in a common trench.

6. The transistor component of claim 1, wherein at least one of the field electrodes comprises a plurality of contact sections spaced apart from one another in a longitudinal direction of the field electrode.

7. The transistor component of claim 1, further comprising:
a gate runner by way of which the plurality of gate electrodes are connected to the gate pad.

8. The transistor component of claim 7, wherein the gate runner comprises at least one section which is connected to the respective gate electrode in a region of at least one longitudinal end of each gate electrode.

9. The transistor component of claim 7, wherein the gate runner comprises a first section connected to the respective gate electrode in a region of a first longitudinal end of each gate electrode, and a second section connected to the respective gate electrode in a region of a second longitudinal end of each gate electrode, and wherein the second longitudinal end is situated opposite the first longitudinal end.

10. The transistor component of claim 7, wherein the gate runner is arranged in a manner spaced apart from the source metallization.

11. The transistor component of claim 7, wherein the gate runner and the source metallization comprise the same metallization.

12. The transistor component of claim 1, wherein the source metallization is a single continuous electrode.

13. The transistor component of claim 1, further comprising:
at least one drift region of a first doping type, which is arranged adjacent to and in a manner insulated from the field electrodes;
a plurality of body regions of a second doping type, each of which is arranged adjacent to and in the manner insulated from at least one of the plurality of gate electrodes;
a plurality of source regions of the first doping type, each of which adjoins one of the plurality of body regions, is connected to the source metallization and is separated from the drift region by the adjoining body region; and
at least one drain region spaced apart from the plurality of body regions, wherein the at least one drift region is arranged between the at least one drain region and the plurality of body regions.

14. The transistor component of claim 13, wherein the body regions are arranged in a manner spaced apart from an insulation layer which insulates the gate connecting electrode from the semiconductor body, and the drift region extends as far as the insulation layer.

15. The transistor component of claim 1, wherein the further trench is a trench which is directly adjacent to the trench with the two sections.

16. The transistor component of claim 1, wherein the gate pad and the source metallization are arranged in a region of the same side of the semiconductor body.

17. The transistor component of claim 1, wherein the gate pad and the source metallization are arranged in a region of opposite sides of the semiconductor body.

18. A transistor component, comprising:
a plurality of gate electrodes and a plurality of field electrodes, wherein in each case one of the plurality of gate electrodes and one of the plurality of field electrodes are arranged one above another in a vertical direction in a common trench of a semiconductor body;
a gate pad to which the plurality of gate electrodes are connected; and
a source metallization arranged above the semiconductor body,
wherein the plurality of field electrodes comprise a first group of field electrodes,
wherein the field electrodes of the first group comprise at least one contact section,
wherein the at least one contact section is arranged between two sections of a gate electrode arranged in the same trench and is connected to the source metallization,
wherein the two sections of the gate electrode are separated from one another in a region of the contact section,
wherein at least one of the two sections of the gate electrode arranged in the same trench is electrically connected to a gate electrode arranged in a further trench by way of a gate connecting electrode, and
wherein at least one of the field electrodes does not comprise a contact section and is connected to at least one of the plurality of field electrodes which comprises at least one contact section by way of at least one further gate connecting electrode.

19. A transistor component, comprising:
a plurality of gate electrodes and a plurality of field electrodes, wherein in each case one of the plurality of gate electrodes and one of the plurality of field electrodes are arranged one above another in a vertical direction in a common trench of a semiconductor body;
a gate pad to which the plurality of gate electrodes are connected;
a source metallization arranged above the semiconductor body; and
a plurality of source regions connected to the source metallization,
wherein the plurality of field electrodes comprise a first group of field electrodes,
wherein the field electrodes of the first group comprise at least one contact section,
wherein the at least one contact section is arranged between two sections of a gate electrode arranged in the same trench and is connected to the source metallization,
wherein the two sections of the gate electrode are separated from one another in a region of the contact section,
wherein at least one of the two sections of the gate electrode arranged in the same trench is electrically connected to a gate electrode arranged in a further trench by way of a gate connecting electrode,
wherein the gate connecting electrode is insulated from the semiconductor body by an insulation layer, and
wherein the plurality of source regions are arranged in a manner spaced apart from the insulation layer.

* * * * *